(12) United States Patent
Kawauchi et al.

(10) Patent No.: US 12,538,720 B2
(45) Date of Patent: Jan. 27, 2026

(54) BONDING SYSTEM

(71) Applicant: Tokyo Electron Limited, Tokyo (JP)

(72) Inventors: Takuo Kawauchi, Tokyo (JP);
Masataka Matsunaga, Koshi (JP);
Ryoichi Sakamoto, Koshi (JP);
Masaru Honda, Koshi (JP); Satoshi Nishimura, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 645 days.

(21) Appl. No.: 17/995,931

(22) PCT Filed: Mar. 30, 2021

(86) PCT No.: PCT/JP2021/013436
§ 371 (c)(1),
(2) Date: Oct. 11, 2022

(87) PCT Pub. No.: WO2021/210380
PCT Pub. Date: Oct. 21, 2021

(65) Prior Publication Data
US 2023/0207331 A1 Jun. 29, 2023

(30) Foreign Application Priority Data

Apr. 13, 2020 (JP) ................................ 2020-071650

(51) Int. Cl.
*H01L 21/447* (2006.01)
*H01L 21/02* (2006.01)
(Continued)

(52) U.S. Cl.
CPC ...... *H01L 21/447* (2013.01); *H01L 21/02002* (2013.01); *H01L 21/67201* (2013.01); *H01L 21/6773* (2013.01); *H01L 21/67739* (2013.01)

(58) Field of Classification Search
CPC ............ H01L 21/447; H01L 21/02002; H01L 21/67201; H01L 21/6773; H01L 21/67739
See application file for complete search history.

(56) References Cited

U.S. PATENT DOCUMENTS

2018/0019225 A1* 1/2018 Matsunaga ............ H01L 24/75
2018/0342409 A1 11/2018 Shindo

FOREIGN PATENT DOCUMENTS

| CN | 107611060 A | 1/2018 |
| CN | 108933097 A | 12/2018 |

(Continued)

OTHER PUBLICATIONS

International Search Report for PCT/JP2021/013436 dated Jun. 29, 2021.

*Primary Examiner* — George R Koch
(74) *Attorney, Agent, or Firm* — Chrisman Gallo Tochtrop LLC

(57) ABSTRACT

A first transfer device and a second transfer device are configured to transfer a first substrate and a second substrate in a normal pressure atmosphere. A third transfer device is configured to transfer the first substrate and the second substrate in a decompressed atmosphere. A load lock chamber has accommodation sections allowed to accommodate therein the first substrate and the second substrate, and is allowed to switch an inside of the accommodation sections between the normal pressure atmosphere and the decompressed atmosphere. Multiple gates are respectively disposed on three different sides of the load lock chamber, and allowed to open or close the load lock chamber. The first transfer device, the second transfer device, and the third transfer device carry the first substrate and the second substrate into/out of the load lock chamber through different gates among the multiple gates.

14 Claims, 10 Drawing Sheets

(51) Int. Cl.
  *H01L 21/67* (2006.01)
  *H01L 21/677* (2006.01)

(56) References Cited

FOREIGN PATENT DOCUMENTS

| | | | |
|---|---|---|---|
| JP | 2008-010670 A | 1/2008 | |
| JP | 2011-146656 A | 7/2011 | |
| JP | 2011236479 A | * 11/2011 | ............ C23C 18/02 |
| JP | 2013-247292 A | 12/2013 | |
| JP | 2018-010921 A | 1/2018 | |
| KR | 10-2014-0051243 A | 4/2014 | |
| KR | 10-2018-0007314 A | 1/2018 | |

* cited by examiner

BONDING SYSTEM

CROSS-REFERENCE TO RELATED APPLICATIONS

This Application is a U.S. national phase application under 35 U.S.C. § 371 of PCT Application No. PCT/JP2021/013436 filed on Mar. 30, 2021, which claims the benefit of Japanese Patent Application No. 2020-071650 filed on Apr. 13, 2020, the entire disclosures of which are incorporated herein by reference.

TECHNICAL FIELD

The various aspects and embodiments described herein pertain generally to a bonding system.

BACKGROUND

Conventionally, in order to meet the requirement for high integration of semiconductor devices, it has been proposed to use a three-dimensional integration technique of stacking semiconductor devices three-dimensionally. As a system using this three-dimensional integration technique, there is known, for example, a bonding technique of bonding substrates such as semiconductor wafers to each other.

As one of bonding techniques, there is known a method of directly bonding substrates by chemical bonding without using an adhesive or the like. A bonding system using this method is equipped with a surface modifying apparatus configured to modify bonding surfaces of first and second substrates, a hydrophilizing apparatus configured to hydrophilize the bonding surfaces of the first and second substrates after the modification, and a bonding apparatus configured to bond the first and second substrates after the hydrophilization. In addition, the bonding system includes a plurality of substrate transfer devices configured to transfer the first and second substrates between the apparatuses.

Patent Document 1: Japanese Patent Laid-open Publication No. 2018-010921

SUMMARY

In an exemplary embodiment, a bonding system configured to form a combined substrate by bonding a first substrate and a second substrate with an intermolecular force includes a first transfer device and a second transfer device, a third transfer device, a load lock chamber and multiple gates. The first transfer device and the second transfer device are each configured to transfer the first substrate and the second substrate in a normal pressure atmosphere. The third transfer device is configured to transfer the first substrate and the second substrate in a decompressed atmosphere. The load lock chamber has an accommodation section allowed to accommodate therein the first substrate and the second substrate, and is allowed to switch an inside of the accommodation section between the normal pressure atmosphere and the decompressed atmosphere. The multiple gates are respectively disposed on three different sides of the load lock chamber, and allowed to open or close the load lock chamber. The first transfer device, the second transfer device, and the third transfer device carry the first substrate and the second substrate into/out of the load lock chamber through different gates among the multiple gates.

DETAILED DESCRIPTION

Figure 1:
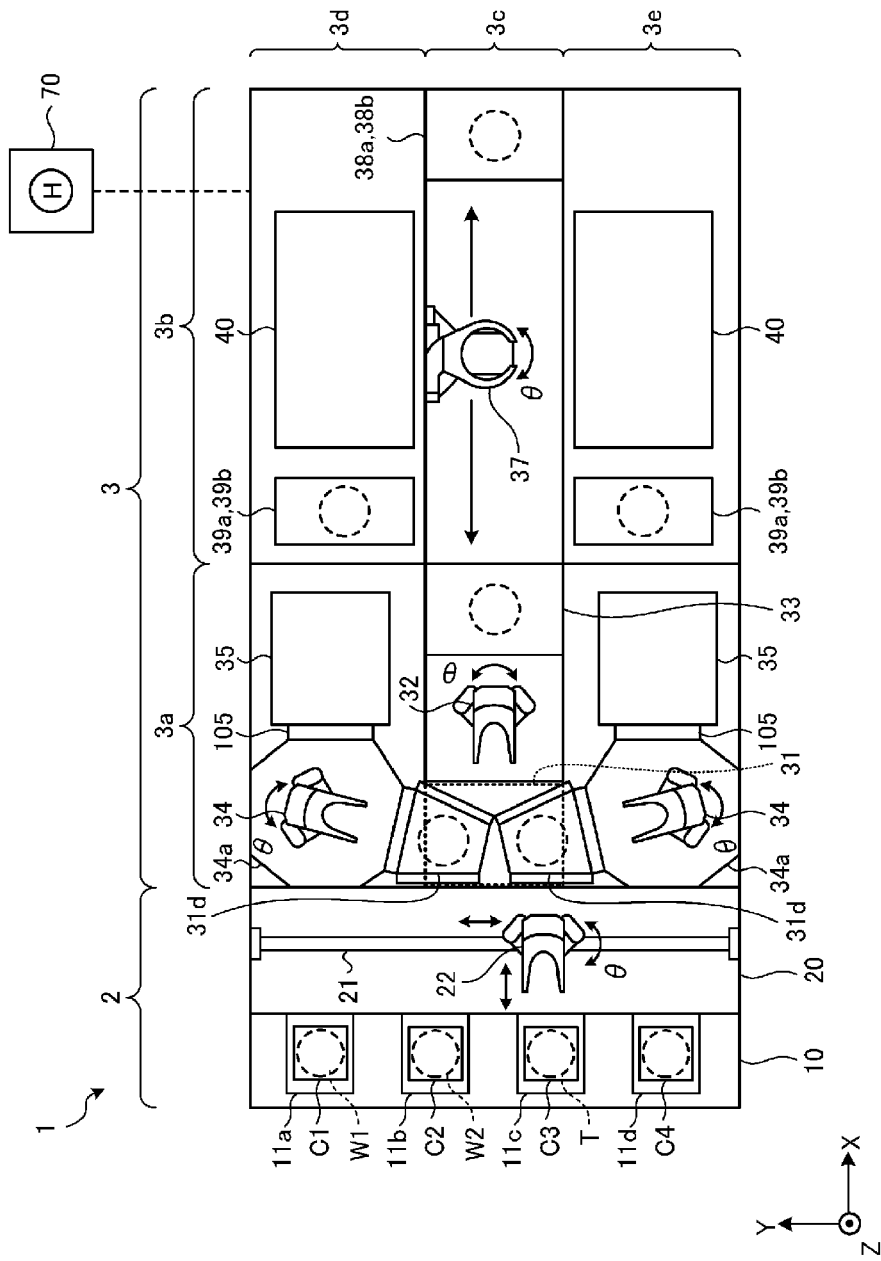
FIG. 1 is a schematic plan view illustrating a configuration of a bonding system according to an exemplary embodiment.

Hereinafter, embodiments (hereinafter, referred to as "exemplary embodiments") for a bonding system according to the present disclosure will be described in detail with reference to the accompanying drawings. Further, it should be noted that the present disclosure is not limited by the exemplary embodiments. Further, unless processing contents are contradictory, the various exemplary embodiments can be appropriately combined. Furthermore, in the various exemplary embodiments to be described below, same parts will be assigned same reference numerals, and redundant description will be omitted.

Further, in the following exemplary embodiments, expressions such as "constant," "perpendicular," "vertical" and "parallel" may be used. These expressions, however, do not imply strictly "constant", "perpendicular," "vertical" and "parallel". That is, these expressions allow some tolerable errors in, for example, manufacturing accuracy, installation accuracy, or the like.

Moreover, in the various accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction. Further, a rotational direction around a vertical axis may be referred to as "θ direction."

<1. Configuration of Bonding System>

Figure 2:
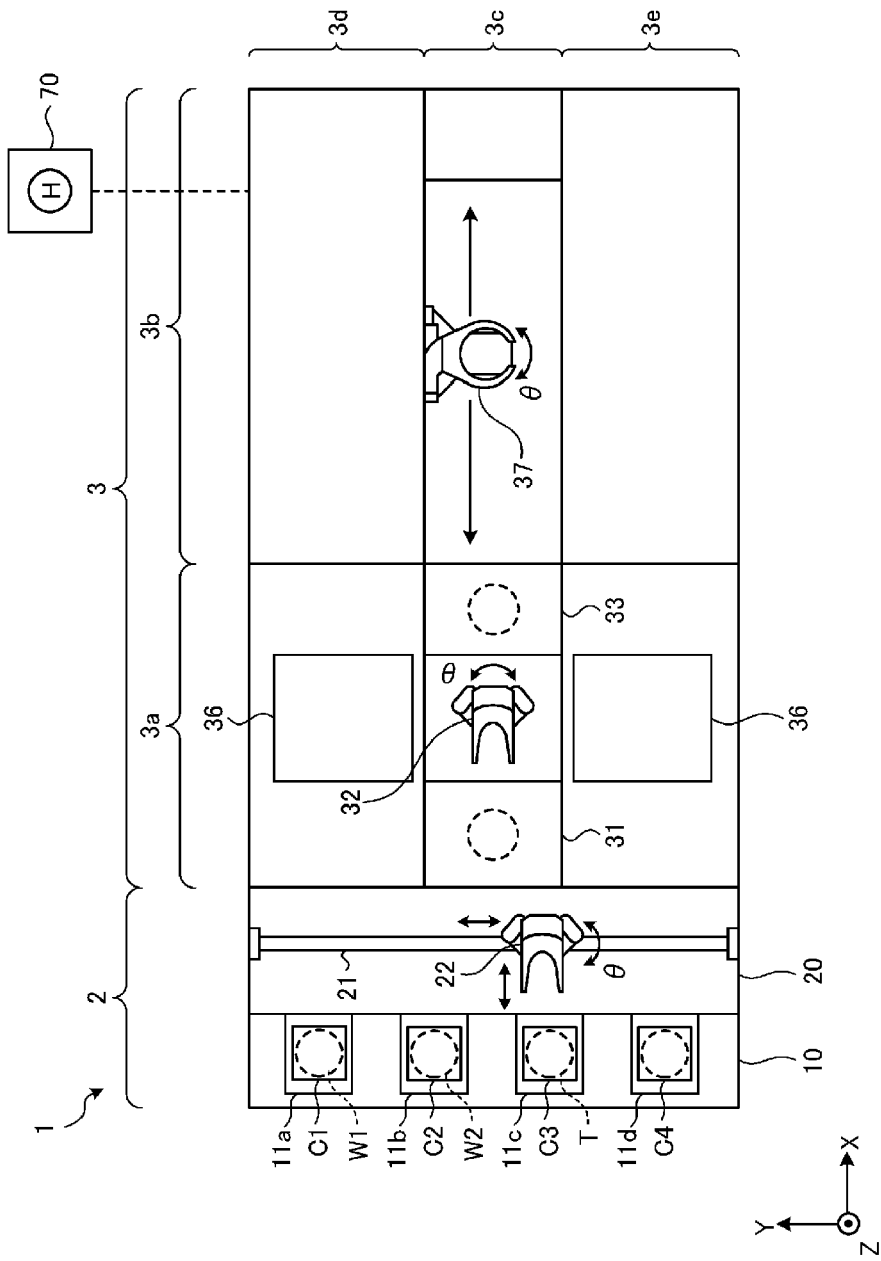
FIG. 2 is a schematic plan view illustrating the configuration of the bonding system according to the exemplary embodiment.

First, a configuration of a bonding system according to an exemplary embodiment will be described with reference to FIG. 1 to FIG. 3. FIG. 1 and FIG. 2 are schematic plan views illustrating the configuration of the bonding system according to the exemplary embodiment.

Further, the bonding system according to the exemplary embodiment has a two-layer structure with an upper layer and a lower layer which are broadly divided. FIG. 1 mainly illustrates a configuration of the lower layer, and FIG. 2 mainly shows a configuration of the upper layer. Further, FIG. 3 is a layout diagram of the bonding system according to the exemplary embodiment. FIG. 4 is a schematic side view of a first substrate and a second substrate.

Figure 3:
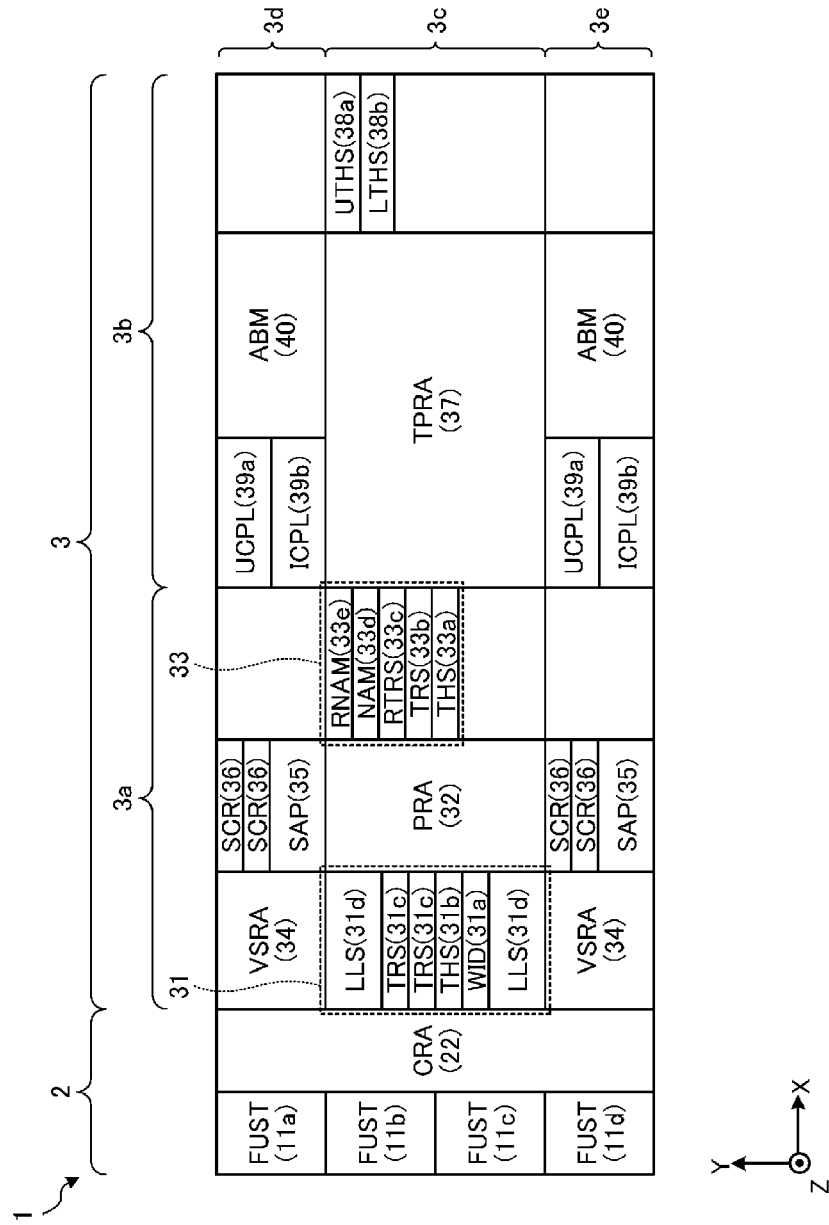
FIG. 3 is a layout diagram of the bonding system according to the exemplary embodiment.
Figure 4:
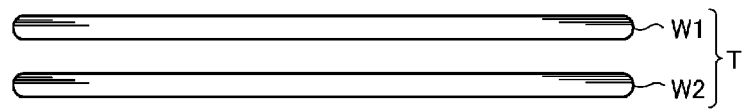
FIG. 4 is a schematic side view of a first substrate and a second substrate.

A bonding system 1 according to the present exemplary embodiment shown in FIG. 1 to FIG. 3 forms a combined substrate T by bonding a first substrate W1 and a second substrate W2 (see FIG. 4).

The first substrate W1 is, for example, a semiconductor substrate such as a silicon wafer or a compound semiconductor wafer having a plurality of electronic circuits formed thereon. The second substrate W2 is, for example, a bare wafer having no electronic circuit formed thereon. The first substrate W1 and the second substrate W2 have approximately the same diameter.

Further, the second substrate W2 may have an electronic circuit formed thereon. As the aforementioned compound semiconductor wafer, one containing, by way of example, gallium arsenide, silicon carbide, gallium nitride, indium phosphide, or the like may be used, but is not limited thereto.

As shown in FIG. 1, the bonding system 1 includes a carry-in/out block 2 and a processing block 3. Further, the processing block 3 is equipped with a first processing block 3a and a second processing block 3b.

The carry-in/out block 2, the first processing block 3a and the second processing block 3b are arranged in the order of the carry-in/out block 2, the first processing block 3a and the second processing block 3b along the positive X-axis direction, and are connected as one body.

(Carry-In/Out Block)

The carry-in/out block 2 is equipped with a placing table 10 and a transfer area 20. The placing table 10 includes a plurality of placing plates 11a to 11d. Cassettes C1 to C4 each capable of accommodating therein a plurality of (for example, 25 sheets of) substrates horizontally are arranged on the placing plates 11a to 11d, respectively. The cassette C1 is a cassette for accommodating the first substrate W1; the cassette C2, for accommodating the second substrate W2; and the cassette C3, for accommodating the combined substrate T. In addition, the cassette C4 is, for example, a cassette for collecting a defective substrate.

Further, in the cassettes C1 and C2, the first substrate W1 and the second substrate W2 are accommodated in the same direction with their bonding surfaces facing upwards.

The transfer area 20 is provided adjacent to the positive X-axis side of the placing table 10. A transfer path 21 extending in the Y-axis direction and a first transfer device 22 configured to be movable along the transfer path 21 are provided in the transfer area 20. The first transfer device 22 has, for example, a transfer arm configured to be movable in a vertical direction and a horizontal direction and pivotable around a vertical axis. By using this transfer arm, the first transfer device 22 transfers the first substrate W1, the second substrate W2 and the combined substrate T between the cassettes C1 to C3 placed on the placing plates 11a to 11c and the first processing block 3a.

Specifically, the first transfer device 22 takes out the first substrate W1 from the cassette C1 and transfers it to the first processing block 3a. Further, the first transfer device 22 takes out the second substrate W2 from the cassette C2 and transfers it to the first processing block 3a. Also, the first transfer device 22 receives the combined substrate T from the first processing block 3a and accommodates it in the cassette C3.

In addition, as shown in FIG. 3, in some drawings, the placing plates 11a to 11d may be denoted as "FUST", and the first transfer device 22 may be denoted as "CRA."

(Processing Block)

The processing block 3 (the first processing block 3a and the second processing block 3b) includes a transfer area 3c extending along the X-axis direction, and two processing areas 3d and 3e arranged with the transfer area 3c therebetween. The processing area 3d is disposed on the positive Y-axis side of the transfer area 3c, and the processing area 3e is disposed on the negative Y-axis side of the transfer area 3c. The processing block 3 has a two-layer structure with a lower layer and an upper layer, which will be described later.

(First Processing Block)

The first processing block 3a is adjacent to the transfer area 20 of the carry-in/out block 2. A first stack unit 31, a second transfer device 32, and a second stack unit 33 are disposed in the transfer area 3c of the first processing block 3a. The first stack unit 31, the second transfer device 32, and the second stack unit 33 are arranged in the order of the first stack unit 31, the second transfer device 32 and the second stack unit 33 along the positive X-axis direction.

Specifically, the first stack unit 31 is disposed between the transfer area 20 of the carry-in/out block 2 and the second transfer device 32. The second stack unit 33 is disposed between the second transfer device 32 and the transfer area 3c of the second processing block 3b. The second transfer device 32 is disposed between the first stack unit 31 and the second stack unit 33.

In the first stack unit 31 and the second stack unit 33, a plurality of modules are stacked in the Z-axis direction. For example, as shown in FIG. 3, a reading unit 31a, a first temporary placement unit 31b, two first transition units 31c, and two load lock chambers 31d are stacked in the first stack unit 31.

The reading unit 31a, the first temporary placement unit 31b, the two first transition units 31c, and the two load lock chambers 31d are stacked in the order of the reading unit 31a, the first temporary placement unit 31b, the two first transition units 31c and the two load lock chambers 31d in sequence from the bottom, for example.

The reading unit 31a is a module configured to read identification information attached to the first substrate W1 and the second substrate W2.

The first temporary placement unit 31b is a place where the first substrate W1 and the second substrate W2 are temporarily placed. For example, when the position of the first substrate W1 or the second substrate W2 held by the second transfer device 32 is deviated from a reference position, the second transfer device 32 temporarily places this substrate in the first temporary placement unit 31b and corrects the deviated position thereof, thus canceling the position deviation of the substrate.

The first transition unit 31c is a place where the combined substrate T is placed. Specifically, the delivery of the combined substrate T from the second transfer device 32 to the first transfer device 22 is performed in the first transition unit 31c.

The load lock chamber 31d has an accommodation section capable of accommodating the first substrate W1 and the second substrate W2 therein. The accommodation section of the load lock chamber 31d is connected to a suction device such as a vacuum pump via a suction line, and the accommodation section can be switched between a normal pressure atmosphere and a decompressed atmosphere by the suction device.

In the exemplary embodiment, the two load lock chambers 31d are not stacked on top of each other, but are arranged side by side in a horizontal direction (Y-axis direction) (see FIG. 1). A specific configuration and the like of the load lock chamber 31d will be described later.

Further, in some drawings, the reading unit 31a will be denoted by "WID"; the first temporary placement unit 31b, "THS"; the first transition unit 31c, "TRS"; and the load lock chamber 31d, "LLS".

In the second stack unit 33, a second temporary placement unit 33a, a second transition unit 33b, a third transition unit 33c, a second alignment unit 33d, and a first alignment unit 33e are stacked, for example.

The second temporary placement unit 33a is a place where the first substrate W1 and the second substrate W2 are temporarily placed, the same as the first temporary placement unit 31b disposed in the first stack unit 31. The second transition unit 33b is a place where the combined substrate T is disposed. Specifically, a delivery of the combined substrate T from a fourth transfer device 37 to the second transfer device 32 to be described later is performed in the second transition unit 33b. The third transition unit 33c is a transition unit having an inverting mechanism. The third transition unit 33c is configured to invert, for example, the first substrate W1 which has not been bonded by a bonding apparatus 39 to be described later.

The alignment unit 33d is a module configured to perform alignment of the second substrate W2. By way of example, the second alignment unit 33d is provided with a holder configured to attract, hold and rotate the second substrate W2 and a detector configured to detect a position of a notch of the second substrate W2. The second alignment unit 33d is capable of adjusting the position of the notch of the second substrate W2 by detecting the position of the notch with the detector while rotating the second substrate W2 attracted to and held by the holder, thus adjusting the direction of the second substrate W2 in the horizontal direction.

The first alignment unit 33e is a module configured to perform alignment of the first substrate W1. By way of example, the first alignment unit 33e is equipped with, in addition to the components of the second alignment unit 33d described above, an inverting mechanism configured to invert the first substrate W1 held by the holder. This first alignment unit 33e is capable of adjusting the direction of the first substrate W1 in the horizontal direction, and also capable of inverting front and rear surfaces of the first substrate W1.

In some drawings, the second temporary placement unit 33a will be denoted by "THS"; the second transition unit 33b, "TRS"; the third transition unit 33c, "RTRS"; the second alignment unit 33d, "NAM"; and the first alignment unit 33e, "RNAM".

The second transfer device 32 has a transfer arm configured to be movable in a vertical direction and a horizontal direction and pivotable around a vertical axis, for example. By using this transfer ram, the second transfer device 32 transfers the first substrate W1, the second substrate W2, and the combined substrate T to/from the first stack unit 31, the second stack unit 33, and a surface hydrophilizing apparatus 36 to be described later.

In each of the processing areas 3d and 3e of the first processing block 3a, a third transfer device 34, a surface modifying apparatus 35, and a plurality of (two in the present exemplary embodiment) surface hydrophilizing apparatuses 36 are disposed.

The third transfer device 34 and the surface modifying apparatus 35 are arranged in the order of the third transfer device 34 and the surface modifying apparatus 35 along the positive X-axis direction. In addition, the two surface hydrophilizing apparatuses 36 are stacked on top of each other and disposed over the third transfer device 34 (specifically, a transfer chamber 34a) and the surface modifying apparatus 35 (see FIG. 3). Moreover, the surface hydrophilizing apparatuses 36 may be disposed under the third transfer device 34 (specifically, the transfer chamber 34a) and the surface modifying apparatus 35.

As stated above, in the present exemplary embodiment, the surface hydrophilizing apparatus 36 is disposed over or under the third transfer device 34 (transfer chamber 34a) and the surface modifying apparatus 35. Accordingly, since a suction device and a suction line connected to the transfer chamber 34a and the surface modifying apparatus 35 can be collectively provided, the overall system can be downsized.

The third transfer device 34 is disposed in the transfer chamber 34a having a hermetically sealable inside. The third transfer device 34 has a transfer arm configured to be movable in a vertical direction and a horizontal direction and pivotable around a vertical axis, for example. By using this transfer arm, the third transfer device 34 transfers the first substrate W1 and the second substrate W2 between the load lock chamber 31d and the surface modifying apparatus 35.

The transfer chamber 34a is adjacent to the load lock chamber 31d and also adjacent to the surface modifying apparatus 35. A suction device such as a vacuum pump is connected to the transfer chamber 34a via a suction line. If the suction device is operated, the inside of the transfer chamber 34a is decompressed into a decompressed atmosphere.

The transfer chamber 34a is maintained in the decompressed atmosphere by the suction device. Thus, the third transfer device 34 transfers the first substrate W1 and the second substrate W2 in the decompressed atmosphere. Meanwhile, the first transfer device 22 and the second transfer device 32 mentioned above transfers the first substrate W1 and the second substrate W2 in the normal pressure atmosphere.

Here, although the normal pressure is, for example, an atmospheric pressure, it does not need to be exactly the same as the atmospheric pressure, and may be in a pressure range of, e.g., ±10 kPa with respect to the atmospheric pressure.

The surface modifying apparatus 35 is connected to the transfer chamber 34a via a gate valve 105. A suction device such as a vacuum pump is connected to the surface modifying apparatus 35 via a suction line. If the suction device is operated, the inside of the surface modifying apparatus 35 is decompressed into a decompressed atmosphere. Like the transfer chamber 34a, the surface modifying apparatus 35 is also always kept in the decompressed atmosphere.

The surface modifying apparatus 35 is configured to modify the bonding surfaces of the first substrate W1 and the second substrate W2 in the decompressed atmosphere. Specifically, the surface modifying apparatus 35 cuts a $SiO_2$ bond in the bonding surfaces of the first substrate W1 and the second substrate W2 into a single bond of SiO, thus allowing the bonding surfaces to be modified so that they are easily hydrophilized afterwards.

In addition, in the surface modifying apparatus 35, an oxygen gas, which is a processing gas, is excited into plasma under the decompressed atmosphere to be ionized. Then, these oxygen ions are radiated to the bonding surfaces of the first substrate W1 and the second substrate W2, so that the bonding surfaces are modified by being plasma-processed.

The surface hydrophilizing apparatus 36 is configured to hydrophilize the bonding surfaces of the first substrate W1 and the second substrate W2 with a hydrophilizing processing liquid such as, but not limited to, deionized water, and also cleans the bonding surfaces. In the surface hydrophilizing apparatus 36, the deionized water is supplied onto the first substrate W1 or the second substrate W2 while rotating the first substrate W1 or the second substrate W2 held by, for example, a spin chuck. Accordingly, the deionized water supplied onto the first substrate W1 or the second substrate W2 is diffused on the bonding surface of the first substrate W1 or the second substrate W2, so that the bonding surface is hydrophilized.

In addition, in some drawings, the second transfer device 32 will be denoted by "PRA"; the third transfer device 34, "VSRA"; the surface modifying apparatus 35, "SAP"; and the surface hydrophilizing apparatus 36, "SCR."

(Second Processing Block)

The second processing block 3b is positioned adjacent to the second stack unit 33 of the first processing block 3a. In the transfer area 3c of the second processing block 3b, the fourth transfer device 37, a third temporary placement unit 38a, and a fourth temporary placement unit 38b are disposed.

The fourth transfer device 37 is disposed between the second stack unit 33 of the first processing block 3a and the third and fourth temporary placement units 38a and 38b. In addition, the third temporary placement unit 38a and the fourth temporary placement unit 38b are sequentially stacked in the order of the fourth temporary placement unit 38b and the third temporary placement unit 38a from the bottom.

The fourth transfer device 37 is movable along a non-illustrated transfer path extending in the X-axis direction. The fourth transfer device 37 has a transfer arm configured to be movable in a vertical direction and a horizontal direction and pivotable around a vertical axis, for example. By using this transfer arm, the fourth transfer device 37 transfers the first substrate W1, the second substrate W2, and the combined substrate T between the second stack unit 33, the third temporary placement unit 38a, the fourth temporary placement unit 38b, a first temperature control plate 39a to be described later, a second temperature control plate 39b to be described later, and a bonding apparatus 40 to be described later.

The third temporary placement unit 38a is a place where the first substrate W1 is temporarily placed in order to correct the position of the first substrate W1. Likewise, the fourth temporary placement unit 38b is a place where the second substrate W2 is temporarily placed in order to correct the position of the second substrate W2.

Further, in the drawings, the third temporary placement unit 38a will sometimes be denoted by "UTHS", and the fourth temporary placement unit 38b will sometimes be denoted by "LTHS".

The first temperature control plate 39a, the second temperature control plate 39b, and the bonding apparatus 40 are disposed in each of the processing areas 3d and 3e of the second processing block 3b.

The first temperature control plate 39a and the second temperature control plate 39b are sequentially stacked in the order of the second temperature control plate 39b and the first temperature control plate 39a from the bottom.

The first temperature control plate 39a is configured to adjust the temperature of the first substrate W1 to a predetermined temperature. The second temperature control plate 39b is configured to adjust the temperature of the second substrate W2 to a predetermined temperature.

Further, in the drawings, the first temperature control plate 39a will sometimes be denoted by "UCPL" and the second temperature control plate 39b will sometimes be denoted by "ICPL."

The bonding apparatus 40 produces the combined substrate T by bonding the hydrophilized first and second substrates W1 and W2 with an intermolecular force.

Figure 5:
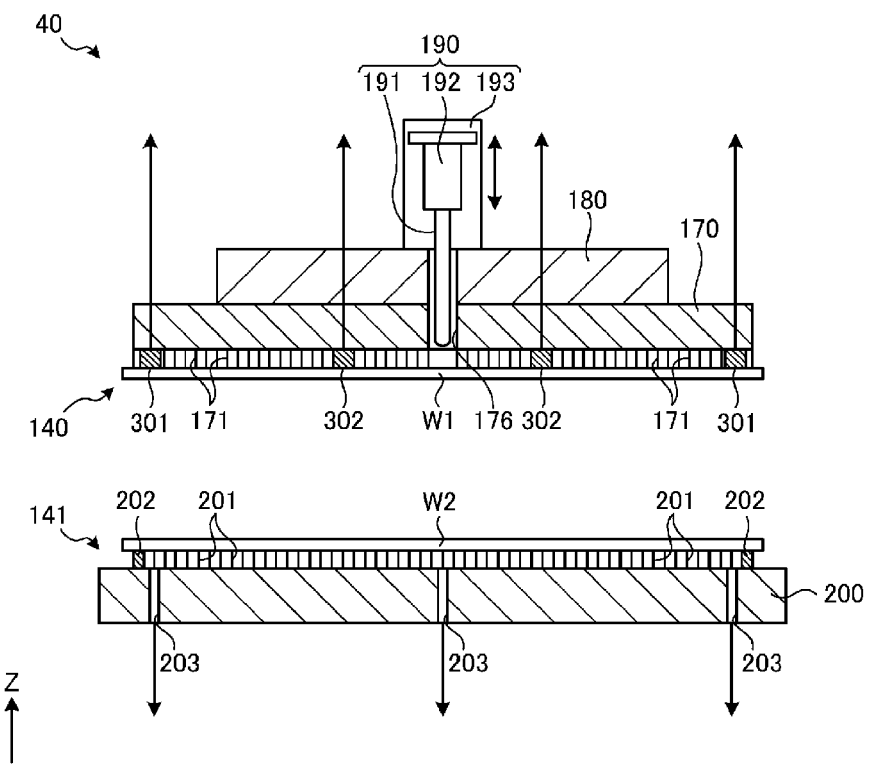
FIG. 5 is a diagram illustrating a configuration of a bonding apparatus according to the exemplary embodiment.

Here, a configuration of the bonding apparatus 40 will be explained with reference to FIG. 5. FIG. 5 is a diagram illustrating the configuration of the bonding apparatus 40 according to the exemplary embodiment.

As depicted in FIG. 5, the bonding apparatus 40 includes a first holder 140, a second holder 141, and a striker 190.

The first holder 140 has a main body 170. The main body 170 is supported by a supporting member 180. A through hole 176 is formed through the supporting member 180 and the main body 170 in a vertical direction. The position of the through hole 176 corresponds to a central portion of the first substrate W1 attracted to and held by the first holder 140. A push pin 191 of the striker 190 is inserted into the through hole 176.

The striker 190 is disposed on a top surface of the supporting member 180, and is equipped with the push pin 191, an actuator unit 192, and a linearly moving mechanism 193. The push pin 191 is a column-shaped member extending along the vertical direction, and is supported by the actuator unit 192.

The actuator unit 192 generates a constant pressure in a preset direction (here, vertically downwards) by air supplied from, for example, an electro-pneumatic regulator (not shown). By the air supplied from the electro-pneumatic regulator, the actuator unit 192 is capable of controlling a pressing load applied to the central portion of the first substrate W1 when it comes into contact with the central portion of the first substrate W1. In addition, a leading end of the push pin 191 is movable up and down in the vertical direction through the through hole 176 by the air from the electro-pneumatic regulator.

The actuator unit 192 is supported by the linearly moving mechanism 193. The linearly moving mechanism 193 is configured to move the actuator unit 192 in the vertical direction by a driving unit including, for example, a motor.

The striker 190 controls the movement of the actuator unit 192 by the linearly moving mechanism 193, and controls the press load upon the first substrate W1 from the push pin 191 by the actuator 192. With this mechanism, the striker 190 presses the central portion of the first substrate W1 attracted to and held by the first holder 140, thus bringing it into contact with the second substrate W2.

A plurality of pins 171 are provided on a bottom surface of the main body 170 to come into with the top surface (non-bonding surface) of the first substrate W1. By way of non-limiting example, each of the plurality of pins 171 has a diameter of 0.1 mm to 1 mm and a height of several tens of micrometers (μm) to several hundreds of micrometers (μm). These pins 171 are equi-spaced at a distance of, e.g., 2 mm.

The first holder 140 has, on a part of the regions in which the plurality of pins 171 are provided, a plurality of attracting members configured to attract the first substrate W1. Specifically, a plurality of outer attracting members 301 and a plurality of inner attracting members 302 configured to attract the first substrate W1 by evacuation are provided on the bottom surface of the main body 170 of the first holder 140. The plurality of outer attracting members 301 and the plurality of inner attracting members 302 have an arc-shaped attraction region, when viewed from the top. The plurality of outer attracting members 301 and the plurality of inner attracting members 302 have the same height as the pins 171.

The plurality of outer attracting members 301 are disposed on an outer periphery of the main body 170. The plurality of outer attracting members 301 are connected to a suction device (not shown) such as a vacuum pump, and attracts a peripheral portion of the first substrate W1 by evacuation.

Inside the plurality of outer attracting members 301 in a diametrical direction of the main body 170, the plurality of inner attracting members 302 are arranged along a circumferential direction. The plurality of inner attracting members 302 are connected to a suction device (not shown) such as a vacuum pump, and attracts a region between the peripheral portion and the central portion of the first substrate W1 by evacuation.

The second holder 141 will be described. The second holder 141 has a main body 200 whose diameter is equal to or larger than that of the second substrate W2. In the present exemplary embodiment, the second holder 141 having a diameter larger than that of the second substrate W2 is illustrated. A top surface of the main body 200 is a facing surface facing a bottom surface (non-bonding surface) of the second substrate W2.

A plurality of pins 201 are provided on the top surface of the main body 200 to be brought into contact with the bottom surface (non-bonding surface) of the second substrate W2. For example, each of the plurality of pins 201 has a diameter of 0.1 mm to 1 mm and a height of several tens of micrometers (μm) to several hundreds of micrometers (μm). The plurality of pins 201 are equi-spaced at a distance of, e.g., 2 mm.

Moreover, on the top surface of the main body 200, a lower rib 202 is annularly provided outside the plurality of pins 201. The lower rib 202 is formed in an annular shape and supports a peripheral portion of the second substrate W2 over the entire circumference thereof.

In addition, the main body 200 has a plurality of lower suction ports 203. The plurality of lower suction ports 203 are provided in an attraction region surrounded by the lower rib 202. The plurality of lower suction ports 203 are connected to a suction device (not shown) such as a vacuum pump via a non-illustrated suction line.

The second holder 141 decompresses the attraction region surrounded by the lower rib 202 by evacuating the attraction region through the plurality of lower suction ports 203. Accordingly, the second substrate W2 disposed in the attraction region is attracted to and held by the second holder 141.

Since the lower rib 202 supports the peripheral portion of the bottom surface of the second substrate W2 over the entire circumference, the second substrate W2 is properly evacuated, including the peripheral portion thereof. Accordingly, the entire surface of the second substrate W2 can be attracted and held. In addition, since the bottom surface of the second substrate W2 is supported by the plurality of pins 201, it is easy to separate the second substrate W2 from the second holder 141 when the evacuation of the second substrate W2 is released.

This bonding apparatus 40 attracts and holds the first substrate W1 with the first holder 140, and attracts and holds the second substrate W2 with the second holder 141. Thereafter, the bonding apparatus 40 presses the central portion of the first substrate W1 by lowering the push pin 191 of the striker 190 after releasing the attracting/holding of the first substrate W1 by the plurality of inner attracting members 302. Accordingly, the combined substrate T in which the first substrate W1 and the second substrate W2 are bonded to each other is obtained. The combined substrate T is carried out from the bonding apparatus 40 by the fourth transfer device 37. Details of the processing by the bonding apparatus 40 will be elaborated later.

(Control Device)

Further, the bonding system 1 has a control device 70. The control device 70 controls the operation of the bonding system 1. Such a control device 70 is, for example, a computer, and includes a controller and a storage which are not illustrated. The controller includes a microcomputer having a CPU (Central Processing Unit), a ROM (Read Only Memory), a RAM (Random Access Memory), an input/output port, and so forth; and various kinds of circuits. The CPU of the microcomputer implements a control to be described later by reading and executing a program stored in the ROM. Further, the storage may be implemented by, by way of non-limiting example, a semiconductor memory device such as a RAM or a flash memory, or a storage device such as a hard disk or an optical disk.

Further, the program may be recorded on a computer-readable recording medium and installed from the recording medium to the storage of the control device 70. The computer-readable recording medium may be, by way of non-limiting example, a hard disk HD, a flexible disk FD, a compact disk CD, a magnetic optical disk MO, a memory card, or the like.

(Load Lock Chamber)

Figure 6:
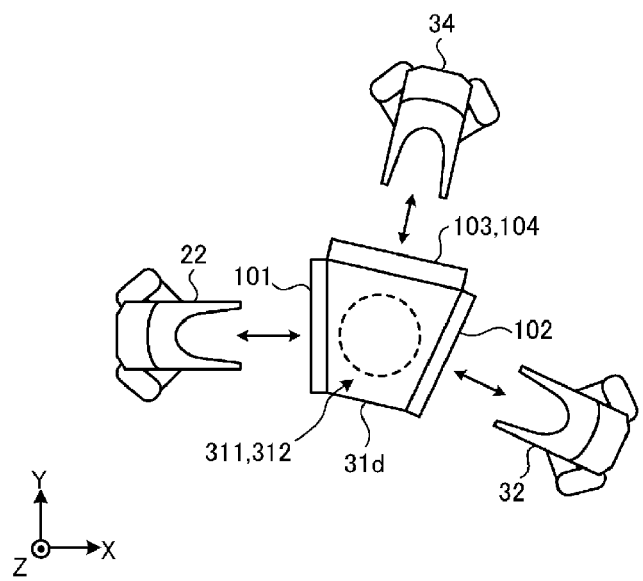
FIG. 6 is a plan view of a load lock chamber according to the exemplary embodiment.
Figure 7:
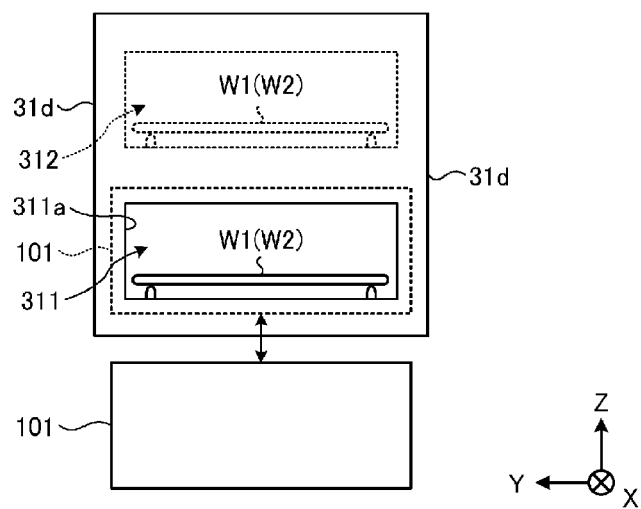
FIG. 7 is a side view of the load lock chamber seen from an access direction of a first transfer device according to the exemplary embodiment.
Figure 8:
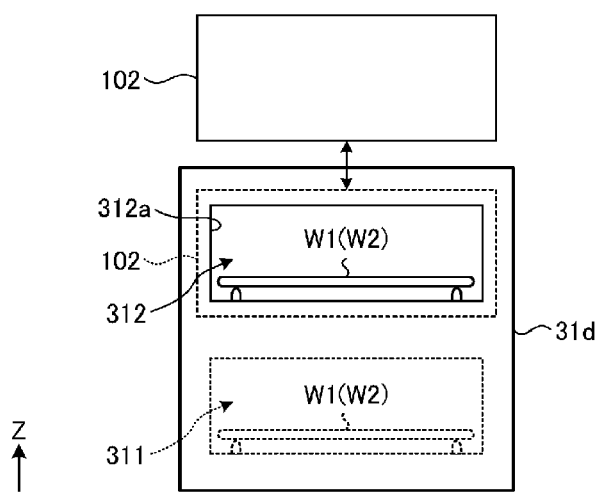
FIG. 8 is a side view of the load lock chamber seen from an access direction of a second transfer device according to the exemplary embodiment.
Figure 9:
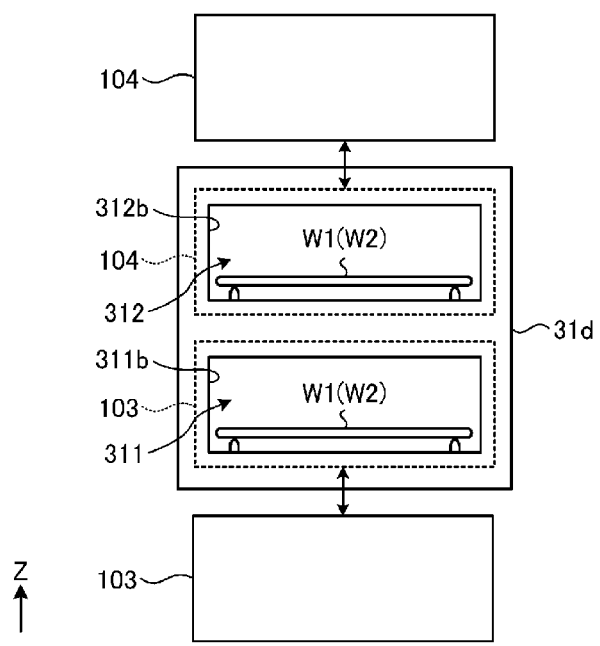
FIG. 9 is a side view of the load lock chamber seen from an access direction of a third transfer device according to the exemplary embodiment.

Next, a specific configuration example of the load lock chamber 31d according to the exemplary embodiment will be described with reference to FIG. 6 to FIG. 9. FIG. 6 is a plan view of the load lock chamber 31d according to the exemplary embodiment. FIG. 7 is a side view of the load lock chamber 31d according to the exemplary embodiment, seen from an access direction of the first transfer device 22. FIG. 8 is a side view of the load lock chamber 31d according to the exemplary embodiment, seen from an access direction of the second transfer device 32. FIG. 9 is a side view of the load lock chamber 31d according to the exemplary embodiment, seen from an access direction of the third transfer device 34.

As illustrated in FIG. 6, the load lock chamber 31d according to the exemplary embodiment is accessed by the first transfer device 22, the second transfer device 32, and the third transfer device 34.

Specifically, in the load lock chamber 31d, a plurality of (here, four) gate valves 101 to 104 are respectively provided on three different lateral sides of the load lock chamber 31d. Each of the gate valves 101 to 104 is capable of opening or closing an accommodation section for the first substrate W1 and the second substrate W2 provided inside the load lock chamber 31d.

More specifically, as shown in FIG. 7 to FIG. 9, the accommodation section included in the load lock chamber 31d is divided into a first accommodation section 311 and a second accommodation section 312 stacked in a height direction. The first accommodation section 311 and the second accommodation section 312 can accommodate therein, for example, a single sheet of first substrate W1 or second substrate W2.

As depicted in FIG. 7 and FIG. 9, the first accommodation section 311 has an opening 311a in its side surface facing the first transfer device 22, and has an opening 311b in its side surface facing the third transfer device 34.

A first gate valve 101 is provided at the side surface of the load lock chamber 31d facing the first transfer device 22, and the opening 311a of the first accommodation section 311 is opened or closed by the first gate valve 101. In addition, a third gate valve 103 is provided at the side surface of the load lock chamber 31d facing the third transfer device 34, and the opening 311b of the first accommodation section 311 is opened or closed by the third gate valve 103.

The first accommodation section 311 is connected to a suction device such as a vacuum pump via a suction line. The first accommodation section 311 is evacuated by the suction device in the state that the openings 311a and 311b are closed by the first gate valve 101 and the third gate valve 103, that is, in the state that the first accommodation section 311 is closed. As a result, the atmosphere of the first accommodation section 311 is switched from the normal pressure atmosphere into the decompressed atmosphere.

The first gate valve 101 is opened under the condition that the third gate valve 103 is closed. Thus, the decompressed atmosphere of the transfer chamber 34a in which the third transfer device 34 is disposed is maintained.

As shown in FIG. 8 and FIG. 9, the second accommodation section 312 has an opening 312a in its side surface facing the second transfer device 32, and has an opening 312b in its side surface facing the third transfer device 34.

A second gate valve 102 is provided at the side surface of the load lock chamber 31d facing the second transfer device 32, and the opening 312a of the second accommodation section 312 is opened or closed by the second gate valve 102. Further, a fourth gate valve 104 is provided at the side surface of the load lock chamber 31d facing the third transfer device 34, and the opening 312b of the second accommodation section 312 is opened or closed by the fourth gate valve 104.

The second accommodation section 312 is connected to a suction device different from that of the first accommodation section 311 via a suction line. The second accommodation section 312 is evacuated by the suction device in the state that the openings 312a and 312b are closed by the second gate valve 102 and the fourth gate valve 104, that is, in the state that the second accommodation section 312 is closed. As a result, the atmosphere of the second accommodation section 312 is switched from the normal pressure atmosphere to the decompressed atmosphere.

The second gate valve 102 is opened under the condition that the third gate valve 103 is closed. Thus, the decompressed atmosphere of the transfer chamber 34a in which the third transfer device 34 is disposed is maintained.

In the example of the present exemplary embodiment, the second accommodation section 312 is disposed above the first accommodation section 311. Without being limited thereto, however, the second accommodation section 312 may be disposed below the first accommodation section 311.

The load lock chamber 31d according to the exemplary embodiment is configured as described above, and the first transfer device 22 is accessible to the first accommodation section 311 via the first gate valve 101, and the second transfer device 32 is accessible to the second accommodation section 312 via the second gate valve 102. Further, the third transfer device 34 is accessible to the first accommodation section 311 via the third gate valve 103, and also accessible to the second accommodation section 312 via the fourth gate valve 104.

Thus, in the bonding system 1 according to the exemplary embodiment, the first transfer device 22, the second transfer device 32, and the third transfer device 34 access the load lock chamber 31d via the different gate valves 101 to 104.

<2. Specific Operation of Bonding System>

Figure 10:
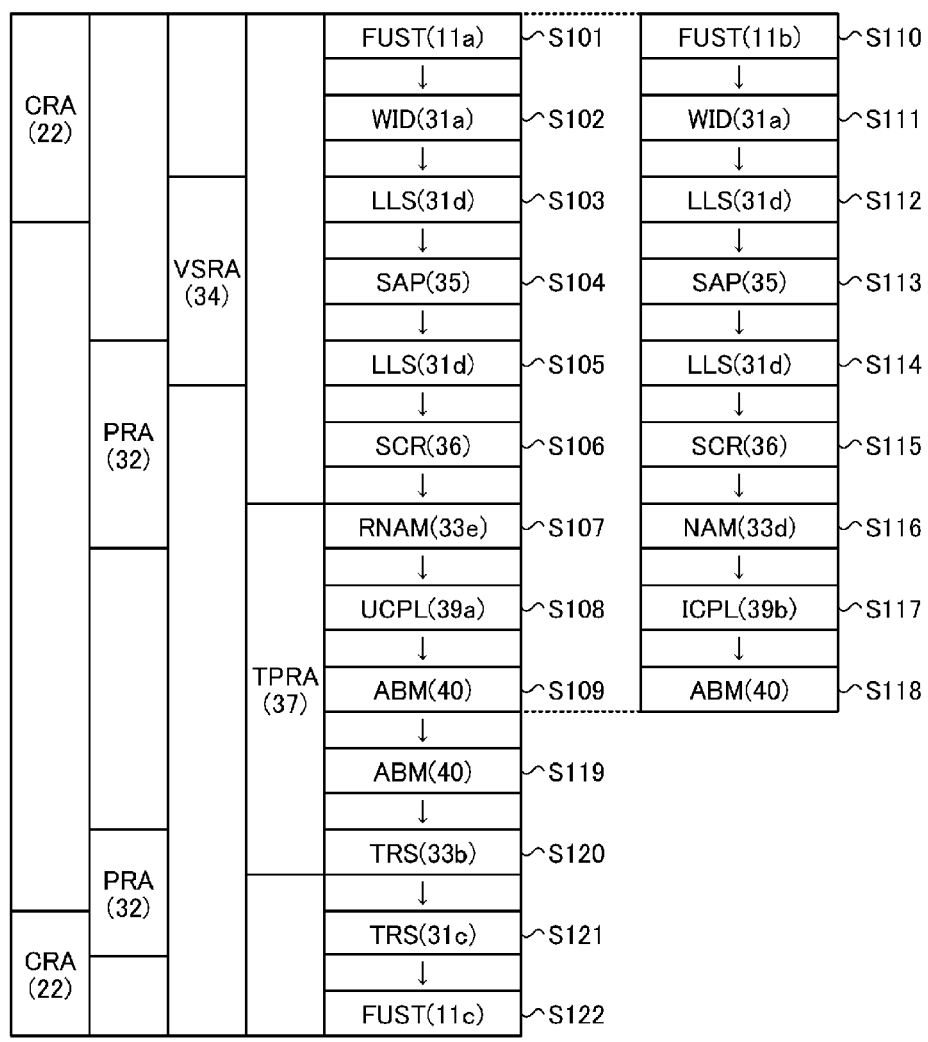
FIG. 10 is a flowchart illustrating a transfer sequence of the first substrate, the second substrate, and a combined substrate in the bonding system according to the exemplary embodiment.

Now, a specific operation of the bonding system 1 according to the exemplary embodiment will be discussed with reference to FIG. 10. FIG. 10 is a flowchart showing a sequence of the transfer of the first substrate W1, the second substrate W2, and the combined substrate T in the bonding system 1 according to the exemplary embodiment. A transfer processing shown in FIG. 10 and various processings in transfer destinations are performed under the control of the control device 70.

First, the cassette C1 accommodating therein a plurality of first substrates W1, the cassette C2 accommodating therein a plurality of second substrates W2, and the empty cassette C3 are respectively placed on the placing plates 11a to 11c of the carry-in/out block 2. Thereafter, the first substrate W1 is taken out by the first transfer device 22 from the cassette C1 placed on the placing plate 11a (process S101), and transferred to the reading unit 31a (process S102). In the reading unit 31a, a reading processing of reading an identification number of the first substrate W1 is performed.

Subsequently, the first substrate W1 is transferred from the reading unit 31a to the load lock chamber 31d by the first transfer device 22 (process S103). Specifically, if the first substrate W1 arrives in front of the load lock chamber 31d, the gate valve 101 is opened and the first substrate W1 is placed in the first accommodation section 311 of the load lock chamber 31d. Thereafter, the gate valve 101 is closed. Then, as the suction device is operated, the first accommodation section 311 is decompressed into a decompressed atmosphere.

Thereafter, the gate valve 103 is opened, and the third transfer device 34 takes out the first substrate W1 from the first accommodation section 311. Further, the gate valve 105 is opened, and the third transfer device 34 transfers the first substrate W1 to the surface modifying apparatus 35 (process S104). Then, the gate valve 105 is closed, and a surface modifying processing of the first substrate W1 is performed in the surface modifying apparatus 35.

Upon the completion of the surface modifying processing, the gate valve 105 is opened, and the third transfer device 34 takes out the first substrate W1 from the surface modifying apparatus 35. Further, the gate valve 104 is opened, and the third transfer device 34 places the first substrate W1 in the second accommodation section 312 of the load lock chamber 31d (process S105). Thereafter, the gate valve 104 is closed, and the second accommodation section 312 is switched from the decompressed atmosphere into an atmospheric atmosphere.

Next, the gate valve 102 is opened, and the second transfer device 32 takes out the first substrate W1 from the second accommodation section 312 and transfers it to the surface hydrophilizing apparatus 36 (process S106). In the surface hydrophilizing apparatus 36, a processing of hydrophilizing the bonding surface of the first substrate W1 and a cleaning processing for this bonding surface are performed.

Subsequently, the first substrate W1 is transferred to the first alignment unit 33e by the second transfer device 32 (process S107). In the first alignment unit 33e, a processing of adjusting the direction of the first substrate W1 in the horizontal direction and a processing of inverting the front and rear surfaces of the first substrate W1 are performed. As a result, the bonding surface of the first substrate W1 is turned to face down.

Next, the first substrate W1 is taken out from the first alignment unit 33e by the fourth transfer device 37 and transferred to the first temperature control plate 39a (process S108). In the first temperature control plate 39a, a processing of adjusting the temperature of the first substrate W1 to a predetermined temperature is performed.

Thereafter, the first substrate W1 is taken out from the first temperature control plate 39a by the fourth transfer device 37 and transferred to the bonding apparatus 40 (process S109). The bonding apparatus 40 attracts and holds the first substrate W1 from above by using the first holder 140 while keeping the bonding surface of the first substrate W1 faced down. The first substrate W1 is held by the first holder 140 with the notch oriented toward a preset direction.

In parallel with the processings of the processes S101 to S109 upon the first substrate W1, processings for the second substrate W2 are also performed. Since the processings in the reading unit 31a, the surface modifying apparatus 35, and the surface hydrophilizing apparatus 36 are the same as those of the first substrate W1, description thereof will be omitted here.

First, the second substrate W2 is taken out by the first transfer device 22 from the cassette C2 placed on the placing plate 11b (process S110), and transferred to the reading unit 31a (process S111). Next, the second substrate W2 is transferred to the first accommodation section 311 of the load lock chamber 31d by the first transfer device 22 (process S112), and is then taken out from the first accommodation section 311 and transferred to the surface modifying apparatus 35 by the third transfer device 34 (process S113).

Next, the second substrate W2 is taken out from the surface modifying apparatus 35 by the third transfer device 34 and placed in the second accommodation section 312 of the load lock chamber 31d (process S114). Thereafter, the second substrate W2 is taken out from the second accommodation section 312 by the second transfer device 32 and transferred to the surface hydrophilizing apparatus 36 (process S115).

Next, the second substrate W2 is taken out from the surface hydrophilizing apparatus 36 by the second transfer device 32, and is transferred to the second alignment unit 33d (process S116). In the second alignment unit 33d, a processing of adjusting the direction of the second substrate W2 in the horizontal direction is performed.

Subsequently, the second substrate W2 is taken out from the second alignment unit 33d by the fourth transfer device 37 and transferred to the second temperature control plate 39b (process S117). In the second temperature control plate 39b, a processing of adjusting the temperature of the second substrate W2 to a predetermined temperature is performed.

Thereafter, the second substrate W2 is taken out from the second temperature control plate 39b by the fourth transfer device 37 and transferred to the bonding apparatus 40 (process S118). The bonding apparatus 40 attracts and holds the second substrate W2 from below by using the second holder 141 while keeping the bonding surface of the second substrate W2 faced up. The second substrate W2 is held by the second holder 141 with the notch oriented toward a preset direction.

Next, in the bonding apparatus 40, a processing of bonding the first substrate W1 and the second substrate W2 is performed. First, the bonding apparatus 40 moves the second holder 141 vertically upwards by using a non-illustrated elevating mechanism, thus allowing the second substrate W2 to approach the first substrate W1.

Then, the attracting/holding of the first substrate W1 by the plurality of inner attracting members 302 is released, and the push pin 191 of the striker 190 is lowered to press the central portion of the first substrate W1.

If the central portion of the first substrate W1 comes into contact with the central portion of the second substrate W2 and those central portions of the first and second substrates W1 and W2 are pressed by the striker 190 with a predetermined force, bonding is begun between the pressed central portions of the first and second substrates W1 and W2. That is, since the bonding surfaces of the first substrate W1 and the second substrate W2 are modified by the surface modifying apparatus 35, a van der Waals force (intermolecular force) is generated between the bonding surfaces, and the bonding surfaces are bonded together. Further, since the bonding surfaces of the first substrate W1 and the second substrate W2 are hydrophilized by the surface hydrophilizing apparatus 36, hydrophilic groups between the bonding surfaces are hydrogen-bonded, so that the bonding surfaces are firmly bonded to each other. In this way, a bonding region is formed.

Thereafter, between the first substrate W1 and the second substrate W2, a bonding wave is generated so the bonding region expands from the central portions of the first and second substrates W1 and W2 toward the peripheral portions thereof. Thereafter, the attracting/holding of the first substrate W1 by the plurality of outer attracting members 301 released. Accordingly, the peripheral portion of the first substrate W1 once attracted to and held by the outer attracting members 301 falls down. As a result, the entire bonding surface of the first substrate W1 and the entire bonding surface of the second substrate W2 come into contact with each other to form the combined substrate T.

Thereafter, the push pin 191 is raised up to the first holder 140 and the attracting/holding of the second substrate W2 by the second holder 141 is released.

The combined substrate T is taken out from the bonding apparatus 40 by the fourth transfer device 37 (process S119), and is then transferred to the second transition unit 33b (process S120). Next, the combined substrate T is taken out from the second transition unit 33b by the second transfer device 32 and transferred to the first transition unit 31c (process S121). Then, the combined substrate T is taken out from the first transition unit 31c by the first transfer device 22 and accommodated in the cassette C3 placed on the placing plate 11C (process S122). Thus, the series of substrate processings by the bonding system 1 are completed.

In the conventional bonding system, a placing table for a first substrate and a second substrate is placed between a first transfer device and a second transfer device, and a load lock chamber is positioned at a place away from the first transfer device. In this conventional bonding system, the first substrate or the second substrate transferred by the first transfer device is delivered to the second transfer device via the placing table, and is then transferred to the load lock chamber by the second transfer device.

On the other hand, in the bonding system 1 according to the exemplary embodiment, the load lock chamber 31d is disposed at the position the first transfer device 22 can access. Specifically, in the bonding system 1 according to the exemplary embodiment, the load lock chamber 31d is disposed between the first transfer device 22 and the second transfer device 32. In this way, in the bonding system 1 according to the exemplary embodiment, by enabling the first transfer device 22 as well to access the load lock chamber 31d, the total length (length in the X-axis direction) of the bonding system can be shortened as much as the space occupied by the placing table in the conventional bonding system. Therefore, according to the bonding system 1 of the exemplary embodiment, a footprint which is a ratio of the bonding system 1 to the floor area such as a clean room can be made small.

Moreover, according to the bonding system 1 of the exemplary embodiment, when transferring the first substrate W1 or the second substrate W2 to the load lock chamber 31d, a process of delivering the first substrate W1 or the second substrate W2 from the first transfer device 22 to the second transfer device 32 becomes unnecessary. Therefore, according to the bonding system 1 of the exemplary embodiment, a throughput of the series of substrate processings performed in the bonding system 1 can be improved.

The accommodation section of the load lock chamber 31d according to the exemplary embodiment is partitioned into the first accommodation section 311 accessed by the first transfer device 22 and the second accommodation section 312 accessed by the second transfer device 32. The first accommodation section 311 and the second accommodation section 312 can be individually switched between the normal pressure atmosphere and the decompressed atmosphere.

By adopting this configuration, one of the first accommodation section 311 and the second accommodation section 312 can be set into the normal pressure atmosphere, while the other is set into the decompressed atmosphere. That is, in the load lock chamber 31d, a carry-in/out operation of the first substrate W1 or the second substrate W2 performed in the normal pressure atmosphere and a carry-in/out operation of the first substrate W1 or the second substrate W2 performed in the decompressed atmosphere can be carried out in parallel. Therefore, according to the bonding system 1 of the exemplary embodiment, the throughput of the series of substrate processings performed in the bonding system 1 can be improved.

In the plan view shown in FIG. 1, the two third transfer devices 34, the two surface modifying apparatuses 35 and the two load lock chambers 31d are symmetrically arranged with respect to a straight line which accords to the arrangement direction (X-axis direction) of the carry-in/out block 2 and the processing block 3 and passes through the second transfer device 32.

The two load lock chambers 31d are disposed in the region surrounded by the carry-in/out block 2, the two third transfer devices 34, and the second transfer device 32. By disposing the two load lock chambers 31d in this way, the footprint can be reduced.

In addition, when viewed from the top, the load lock chamber 31d has a trapezoidal shape with four side surfaces. By forming the load lock chamber 31d to have such a shape, the footprint can be made smaller.

First Modification Example

The bonding system 1 may be further equipped with an inspecting apparatus configured to inspect the first substrate W1 and the second substrate W2. The inspecting apparatus inspects, for example, presence or absence of particles on the bonding surfaces of the first substrate W1 and the second substrate W2.

Figure 11:
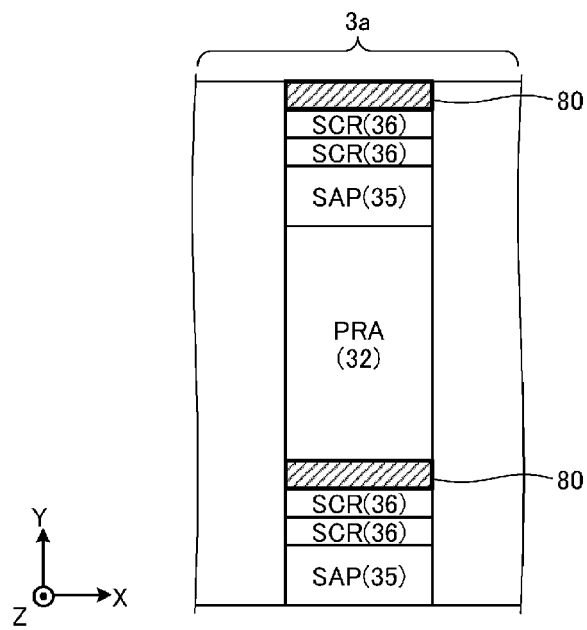
FIG. 11 is a diagram illustrating a layout example of an inspecting apparatus.
Figure 12:
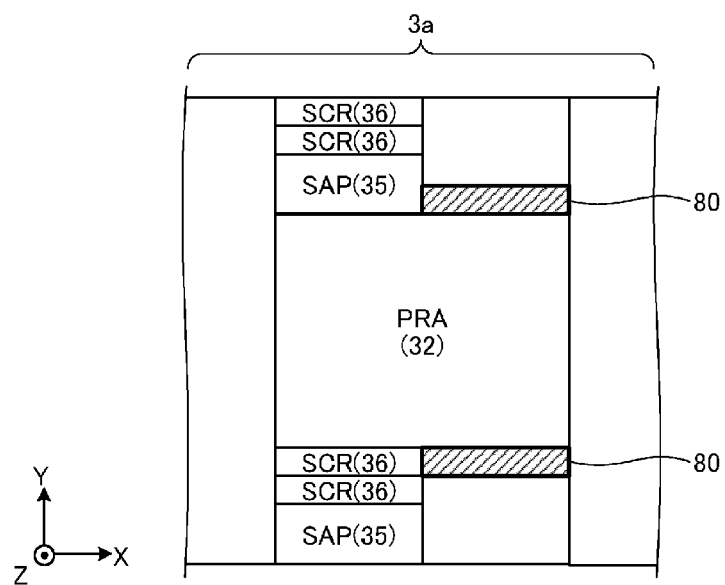
FIG. 12 is a diagram illustrating a layout example of the inspecting apparatus.
Figure 13:
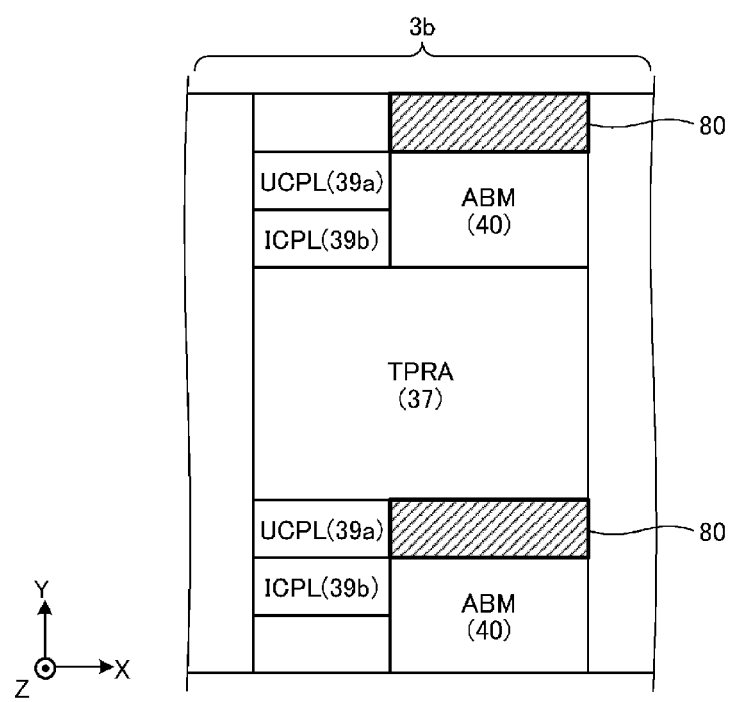
FIG. 13 is a diagram illustrating a layout example of the inspecting apparatus.

FIG. 11 to FIG. 13 are diagrams showing layout examples of the inspecting apparatus. For example, as shown in FIG. 11, the inspecting apparatus 80 may be disposed above the surface hydrophilizing apparatus 36 in the first processing block 3a. That is, the inspecting apparatus 80 may be stacked together with the surface modifying apparatus 35 and the surface hydrophilizing apparatus 36. In addition, the inspecting apparatus 80 may be disposed under the surface hydrophilizing apparatus 36, and may be disposed under the surface modifying apparatus 35. By adopting such layouts, an increase of the footprint can be suppressed.

In addition, as shown in FIG. 12, the inspecting apparatus 80 may be disposed at the side of (next to) the surface hydrophilizing apparatus 36 and the surface modifying apparatus 35 in the first processing block 3a, for example. In this case, the second transfer device 32 may be configured to be movable along the X-axis direction so as to be accessible to both the surface modifying apparatus 35 and the inspecting apparatus 80.

In addition, the surface hydrophilizing apparatus 36 does not necessarily need to be stacked on the surface modifying apparatus 35, and may be disposed at the side of (next to) the surface modifying apparatus 35. In this case, the inspecting apparatus 80 may be disposed above or below the surface hydrophilizing apparatus 36 at the side of the surface modifying apparatus 35.

Furthermore, as shown in FIG. 13, the inspecting apparatus 80 may be disposed above the bonding apparatus 40 in the second processing block 3b. Alternatively, the inspecting apparatus 80 may be disposed under the bonding apparatus 40. By positioning the inspecting apparatus 80 above or below the bonding apparatus 40, the increase of the footprint can be suppressed.

Moreover, the inspecting apparatus 80 disposed in the second processing block 3b is not limited to inspecting the first substrate W1 and the second substrate W2, but may be configured to inspect the combined substrate T.

Second Modification Example

Figure 14:
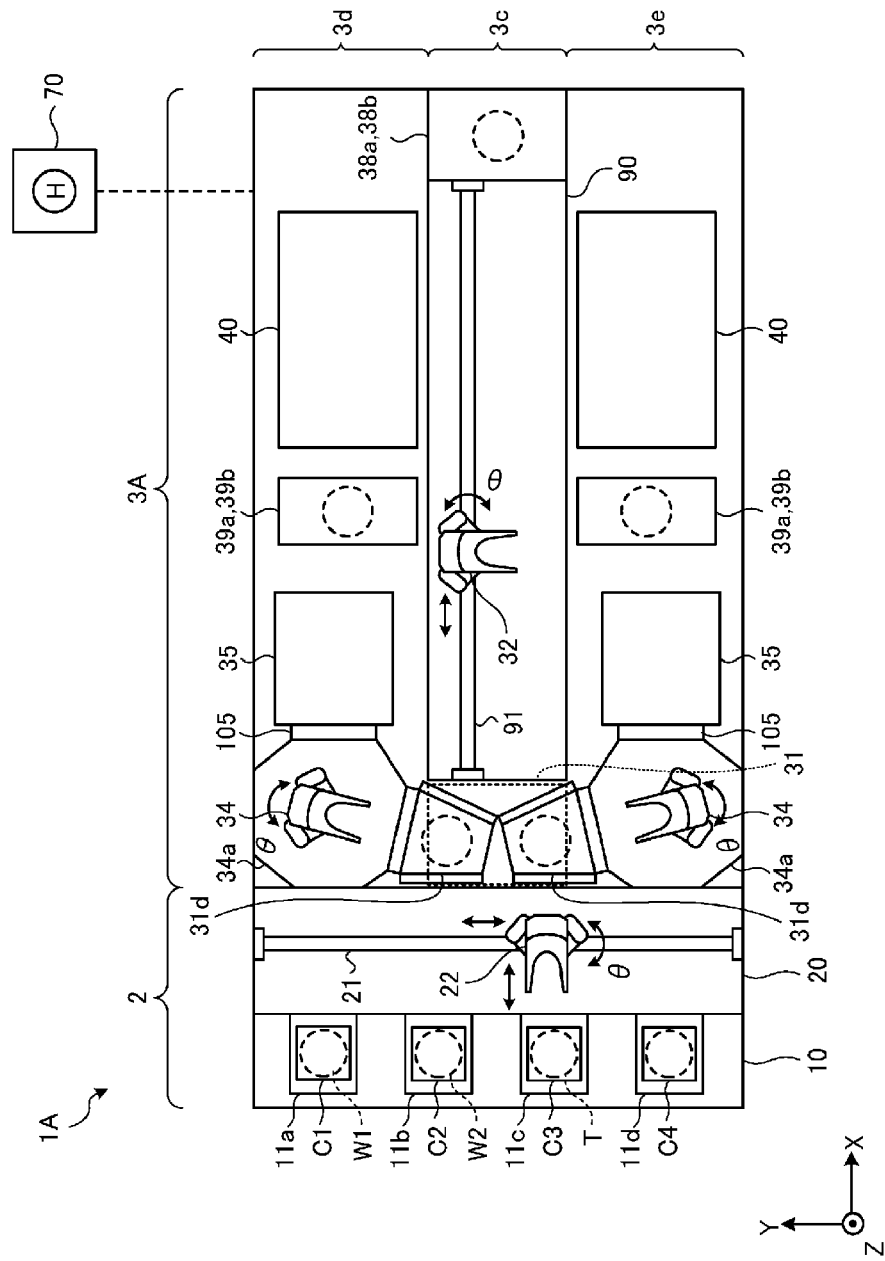
FIG. 14 is a schematic plan view illustrating a configuration of a bonding system according to a second modification example.

Although the above exemplary embodiment has been described for the example where the processing block 3 is divided into the first processing block 3a and the second processing block 3b, the processing block 3 does not need to be divided. An example in which the processing block 3 is not divided will be described with reference to FIG. 14. FIG. 14 is a schematic plan view illustrating a configuration of a bonding system according to a second modification example.

As shown in FIG. 14, a bonding system 1A according to the second modification example includes a processing block 3A. The processing block 3A is provided with a transfer area 90 in the center thereof, and a transfer path 91 extending in the X-axis direction and a second transfer device 32 configured to be movable along this transfer path 91 are disposed in the transfer area 90.

In the processing block 3A, a third transfer device 34, a surface modifying apparatus 35, and a bonding apparatus 40 are disposed on each of the positive Y-axis side and the negative Y-axis side of the transfer area 90. The third transfer device 34, the surface modifying apparatus 35, and the bonding apparatus 40 are arranged in the order of the third transfer device 34, the surface modifying apparatus 35, and the bonding apparatus 40 along the positive X-axis direction.

Further, in the processing block 3A, a first stack unit 31 including load lock chambers 31d is disposed between the transfer area 90 and a carry-in/out block 2. Further, in the processing block 3A, a third temporary placement unit 38a and a fourth temporary placement unit 38b are disposed on the opposite side from the first stack 31 with the transfer area 90 therebetween.

In this way, the bonding system 1A does not need to be divided into the first processing block 3a and the second processing block 3b.

As described above, a bonding system (as an example, the bonding system 1) according to the exemplary embodiment is a bonding system configured to form a combined substrate (as an example, the combined substrate T) by bonding a first substrate (as an example, the first substrate W1) and a second substrate (as an example, the second substrate W2) with an intermolecular force. This bonding system is equipped with a first transfer device (as an example, the first transfer device 22), a second transfer device (as an example, the second transfer 32), a third transfer device (as an example, the third transfer device 34), a load lock chamber (as an example, the load lock chamber 31d), and multiple gates (as an example, the gate valves 101 to 104). The first transfer device and the second transfer device transfer the first substrate and the second substrate in a normal pressure atmosphere. The third transfer device transfers the first substrate and the second substrate in a decompressed atmosphere. The load lock chamber has an accommodation section (as an example, the first accommodation section 311 and the second accommodation section 312) allowed to accommodate therein the first and second substrates, and this accommodation section is allowed to switch an inside of the accommodation section between the normal pressure atmosphere and the decompressed atmosphere. The multiple gates are respectively provided on three different sides of the load lock chamber, and allowed to open or close the load lock chamber. Moreover, the first transfer device, the second transfer device, and the third transfer device carry the first substrate and the second substrate into/out of the load lock chamber through different gates among the multiple gates.

Therefore, according to the bonding system of the exemplary embodiment, a footprint can be reduced.

The bonding system according to the exemplary embodiment includes a carry-in/out block (as an example, the carry-in/out block 2) and a processing block (as an example, the processing block 3). The carry-in/out block may have a placing table (as an example, the placing plates 11a to 11d) on which cassettes (as an example, the cassettes C1 to C4) are disposed. The processing block accommodates therein a surface modifying apparatus (as an example, the surface modifying apparatus 35) configured to modify bonding surfaces (as an example, the bonding surfaces) of the first and second substrates in the decompressed atmosphere, a surface hydrophilizing apparatus (as an example, the surface hydrophilizing apparatus 36) configured to hydrophilize the modified bonding surfaces of the first and second substrates. In this case, the first transfer device may be disposed in the carry-in/out block to transfer the first substrate and the second substrate from the cassette to the load lock chamber. In addition, the third transfer device may be disposed in the processing block to transfer the first substrate and the second substrate from the load lock chamber to the surface modifying apparatus. Moreover, the second transfer device may be disposed in the processing block to transfer the first substrate and the second substrate from the load lock chamber to the surface hydrophilizing apparatus.

The load lock chamber may be disposed between the first transfer device and the second transfer device. In this way, the footprint can be reduced.

The accommodation section may include a first accommodation section (as an example, the first accommodation section 311) and a second accommodation section (as an example, the second accommodation section 312). The first accommodation section is accessed by the first transfer device. The second accommodation section is disposed above or below the first accommodation section, and configured to be switched between the normal pressure atmosphere and the decompressed atmosphere independently of the first accommodation section, and accessed by the second transfer device. Therefore, the throughput can be improved.

When viewed from the top, the two third transfer devices, the two surface modifying apparatuses, and the two load lock chambers are arranged symmetrically with respect to a straight line that accords to an arrangement direction of the carry-in/out block and the processing block and passes through the second transfer device. In addition, the two load lock chambers may be arranged in a region surrounded by the carry-in/out block, the two third transfer devices, and the second transfer device. With this configuration, the footprint can be reduced.

The load lock chamber may have a trapezoidal shape composed of four sides including the three different sides, when viewed from the top. Therefore, the footprint can be further reduced.

The processing block may include, between the carry-in/out block and the second transfer device, a stack unit (as an example, the first stack unit 31) in which multiple modules are stacked. In this case, the load lock chamber may be disposed in the stack unit. In addition, the multiple modules include at least one of a first transition unit (as an example, the first transition unit 31c) in which the combined substrate is delivered from the second transfer device to the first transfer device; a temporary placement unit (as an example, the first temporary placement unit 31b) of the first substrate and the second substrate; or a reading unit (as an example, the reading unit 31a) configured to read identification information attached to the first and second substrates.

The surface hydrophilizing apparatus may be disposed above or below the surface modifying apparatus. With this configuration, the footprint can be further reduced.

The bonding system according to the exemplary embodiment may be equipped with an inspecting apparatus (for example, the inspecting apparatus 80) configured to inspect the first substrate and the second substrate. In this case, the inspecting apparatus may be stacked together with the surface modifying apparatus and the surface hydrophilizing apparatus in the processing block (as an example, the first processing block 3a). Thus, an increase of the footprint can be suppressed.

The bonding system according to the exemplary embodiment may be equipped with a bonding apparatus (as an example, the bonding apparatus 40) configured to bond the first and second substrates, which are hydrophilized, by an intermolecular force. In this case, the bonding apparatus may be disposed in the processing block (as an example, the second processing block 3b).

The processing block may include a first processing block (as an example, the first processing block 3a) and a second processing block (as an example, the second processing block 3b). The first processing block is adjacent to the carry-in/out block, and accommodates the second transfer device, the third transfer device, the surface modifying apparatus, and the surface hydrophilizing apparatus. The second processing block is adjacent to the first processing block. In this case, the bonding apparatus may be disposed in the second processing block.

The first processing block may be equipped with a second transition unit (as an example, the second transition unit 33b) between the second transfer device and the second processing block. In this case, the second processing block may be equipped with a fourth transfer device (as an example, the fourth transfer device 37) configured to transfer the first substrate and the second substrate placed in the second transition unit by the second transfer device to the bonding apparatus.

The bonding system according to the exemplary embodiment may be equipped with an inspecting apparatus (as an example, the inspecting apparatus 80) configured to inspect at least one of the first substrate, the second substrate, or the combined substrate. In this case, the inspecting apparatus may be disposed above or below the bonding apparatus in the second processing block. Thus, an increase in the footprint can be suppressed.

Here, it should be noted that the above-described exemplary embodiments are illustrative in all aspects and are not anyway limiting. In fact, the above-described exemplary embodiments can be embodied in various forms. Further, the above-described exemplary embodiments may be omitted, replaced and modified in various ways without departing from the scope and the spirit of claims.

According to the exemplary embodiments, the footprint can be made small.

We claim:

1. A bonding system configured to form a combined substrate by bonding a first substrate and a second substrate with an intermolecular force, the bonding system comprising:
   a carry-in/out block having a placing table on which a cassette is placed;
   a processing block accommodating therein a surface modifying apparatus configured to modify bonding surfaces of the first substrate and the second substrate in a decompressed atmosphere, and a surface hydrophilizing apparatus configured to hydrophilize the modified bonding surfaces of the first substrate and the second substrate;
   a first transfer device and a second transfer device each configured to transfer the first substrate and the second substrate in a normal pressure atmosphere;
   a third transfer device configured to transfer the first substrate and the second substrate in the decompressed atmosphere;
   a load lock chamber having an accommodation section allowed to accommodate therein the first substrate and the second substrate, and allowed to switch an inside of the accommodation section between the normal pressure atmosphere and the decompressed atmosphere; and
   multiple gates respectively disposed on three different sides of the load lock chamber, and allowed to open or close the load lock chamber,
   wherein the first transfer device is disposed in the carry-in/out block, and configured to transfer the first substrate and the second substrate from the cassette to the load lock chamber,
   the third transfer device is disposed in the processing block, and configured to transfer the first substrate and the second substrate from the load lock chamber to the surface modifying apparatus,
   the second transfer device is disposed in the processing block, and configured to transfer the first substrate and the second substrate from the load lock chamber to the surface hydrophilizing apparatus, and
   the first transfer device, the second transfer device, and the third transfer device carry the first substrate and the second substrate into/out of the load lock chamber through different gates among the multiple gates.

2. The bonding system of claim 1,
   wherein the load lock chamber is disposed between the first transfer device and the second transfer device.

3. The bonding system of claim 1,
   wherein the accommodation section comprises:
   a first accommodation section accessed by the first transfer device; and
   a second accommodation section disposed above or below the first accommodation section, and configured to be switched between the normal pressure atmosphere and the decompressed atmosphere independently of the first accommodation section and accessed by the second transfer device.

4. The bonding system of claim 1,
   wherein the third transfer device includes two third transfer devices, the surface modifying apparatus includes two surface modifying apparatuses, the load lock chamber includes two load lock chambers, and
   the two third transfer devices, the two surface modifying apparatuses, and the two load lock chambers are arranged symmetrically with respect to a straight line which accords to an arrangement direction of the carry-in/out block and the processing block and passes through the second transfer device, when viewed from a top.

5. The bonding system of claim 2,
   wherein the two load lock chambers are disposed in a region surrounded by the carry-in/out block, the two third transfer devices, and the second transfer device.

6. The bonding system of claim 5,
   wherein the load lock chamber has a trapezoidal shape composed of four sides including the three different sides, when viewed from the top.

7. The bonding system of claim 1,
   wherein the processing block comprises, between the carry-in/out block and the second transfer device, a stack unit in which multiple modules are stacked, and the load lock chamber is disposed in the stack unit.

8. The bonding system of claim 7,
   wherein the multiple modules include at least one of a first transition unit in which the combined substrate is delivered from the second transfer device to the first transfer device, a temporary placement unit of the first substrate and the second substrate, or a reading unit configured to read identification information attached to the first substrate and the second substrate.

9. The bonding system of claim 1,
   wherein the surface hydrophilizing apparatus is disposed above or below the surface modifying apparatus.

10. The bonding system of claim 9, further comprising:
    an inspecting apparatus configured to inspect the first substrate and the second substrate,
    wherein the inspecting apparatus is stacked together with the surface modifying apparatus and the surface hydrophilizing apparatus in the processing block.

11. The bonding system of claim 1, further comprising:
    a bonding apparatus configured to bond the first substrate and the second substrate, which are hydrophilized, by an intermolecular force,
    wherein the bonding apparatus is disposed in the processing block.

12. The bonding system of claim 11,
    wherein the processing block comprises:
    a first processing block, provided adjacent to the carry-in/out block, accommodating therein the second transfer device, the third transfer device, the surface modifying apparatus, and the surface hydrophilizing apparatus; and a second processing block adjacent to the first processing block, and wherein the bonding apparatus is disposed in the second processing block.

13. The bonding system of claim 12, wherein the first processing block comprises a transition unit between the second transfer device and the second processing block, and the second processing block comprises a fourth transfer device configured to transfer the first substrate and the second substrate placed in the transition unit by the second transfer device to the bonding apparatus.

14. The bonding system of claim 13, further comprising:

an inspecting apparatus configured to inspect at least one of the first substrate, the second substrate, or the combined substrate, wherein the inspecting apparatus is disposed above or below the bonding apparatus in the second processing block.

\* \* \* \* \*